United States Patent
Imamoto et al.

(10) Patent No.: US 10,535,665 B1
(45) Date of Patent: Jan. 14, 2020

(54) INTEGRATED ASSEMBLIES HAVING CONTINUOUS HIGH-DIELECTRIC FILMS EXTENDING ACROSS CHANNEL REGIONS OF ADJACENT TRANSISTORS

(71) Applicant: Micron Technology, Inc., Boise, ID (US)

(72) Inventors: Takuya Imamoto, Hiroshima (JP); Takeshi Nagai, Hiroshima (JP); Yoichi Fukushima, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/124,604

(22) Filed: Sep. 7, 2018

(51) Int. Cl.
| | |
|---|---|
| *G11C 7/00* | (2006.01) |
| *H01L 27/108* | (2006.01) |
| *G11C 11/4091* | (2006.01) |
| *H01L 29/49* | (2006.01) |
| *H01L 27/092* | (2006.01) |
| *H01L 29/51* | (2006.01) |

(52) U.S. Cl.
CPC .... *H01L 27/10897* (2013.01); *G11C 11/4091* (2013.01); *H01L 27/092* (2013.01); *H01L 29/4966* (2013.01); *H01L 29/4983* (2013.01); *H01L 29/513* (2013.01); *H01L 29/517* (2013.01); *H01L 29/518* (2013.01)

(58) Field of Classification Search
CPC .................................................. G11C 11/4091
USPC .......................................................... 365/205
See application file for complete search history.

(56) References Cited

U.S. PATENT DOCUMENTS

| | | | |
|---|---|---|---|
| 2013/0021840 A1* | 1/2013 | Tokita | H01L 21/823842 365/156 |
| 2013/0154013 A1* | 6/2013 | Nishisaka | H01L 29/6659 257/368 |
| 2015/0380504 A1* | 12/2015 | Nagai | H01L 21/823842 257/401 |
| 2017/0200719 A1* | 7/2017 | Bao | H01L 27/092 |

* cited by examiner

*Primary Examiner* — Hoai V Ho
(74) *Attorney, Agent, or Firm* — Wells St. John P.S.

(57) ABSTRACT

Some embodiments include an integrated assembly having a first transistor adjacent to a second transistor. The first transistor has a first conductive gate material over a first insulative region, and the second transistor has a second conductive gate material over a second insulative region. A continuous high-k dielectric film extends across both of the first and second insulative regions. In some embodiments, the transistors may be incorporated into a sense amplifier.

18 Claims, 14 Drawing Sheets

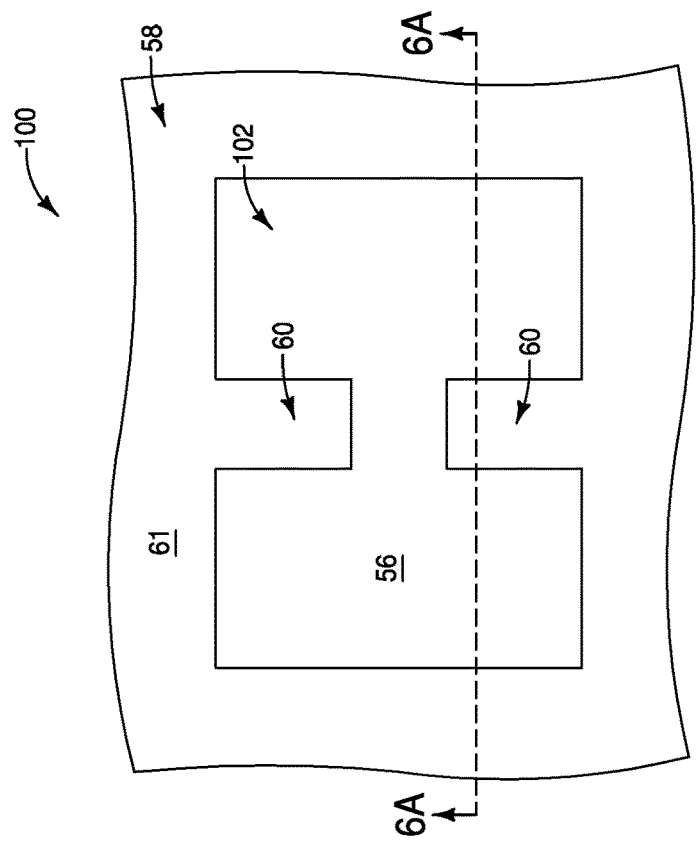
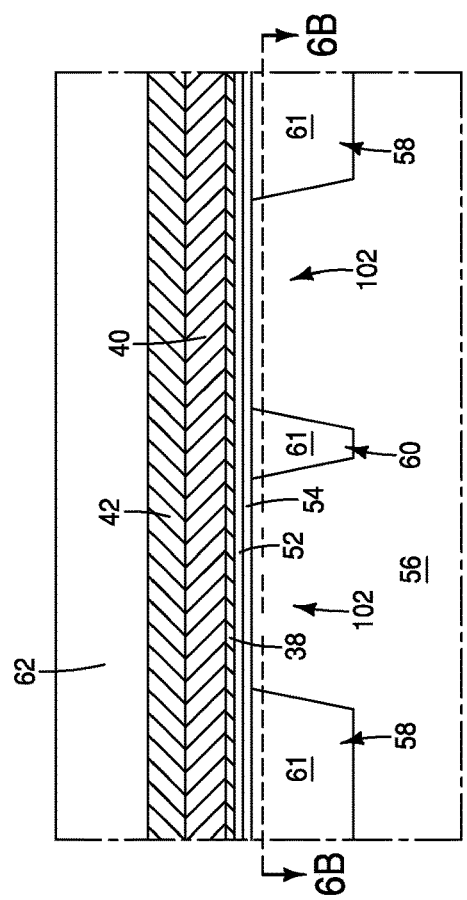
FIG. 6B
FIG. 6A

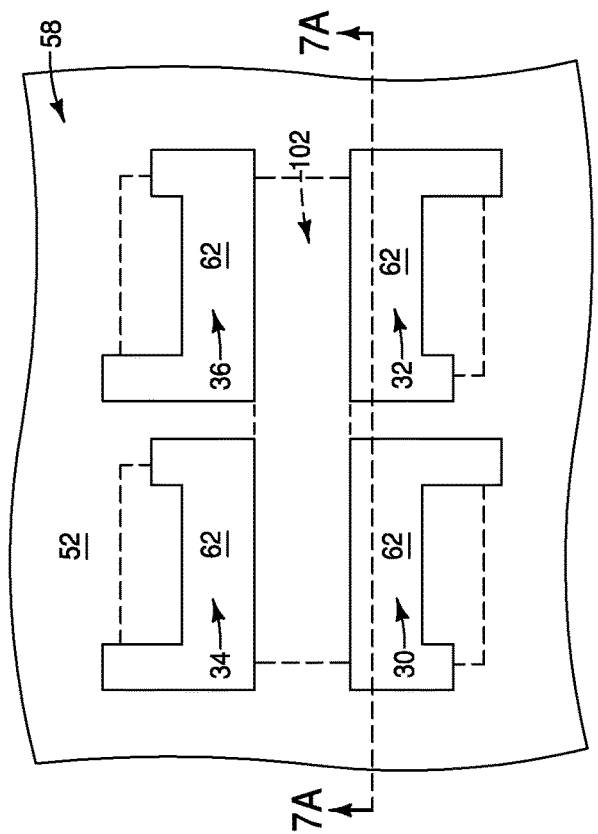
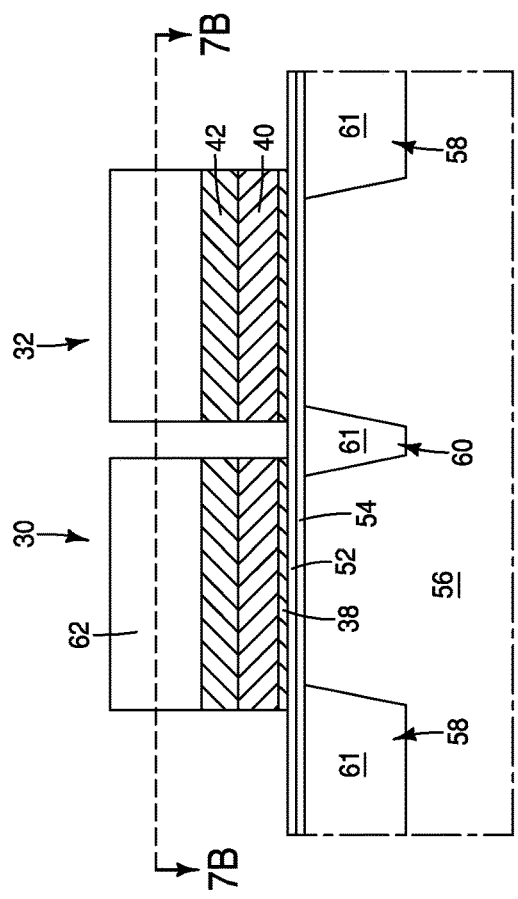
FIG. 7B
FIG. 7A

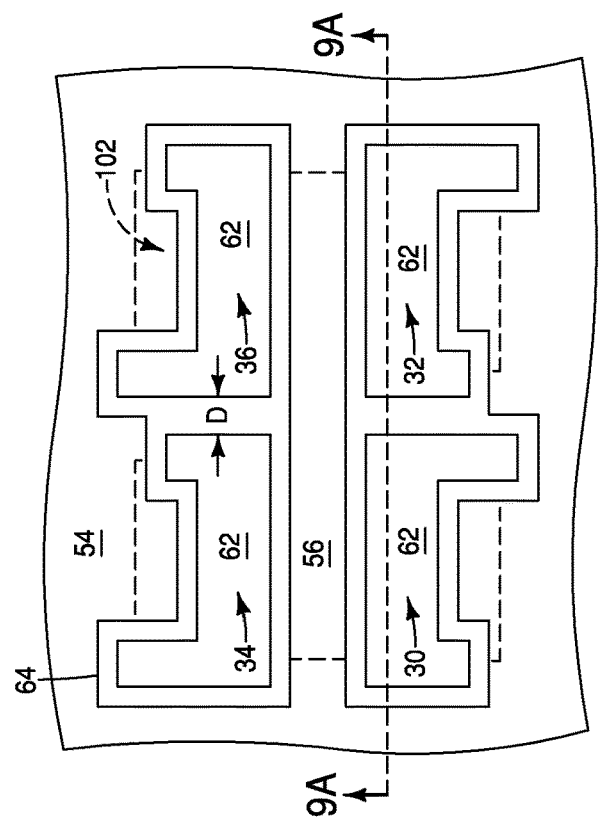
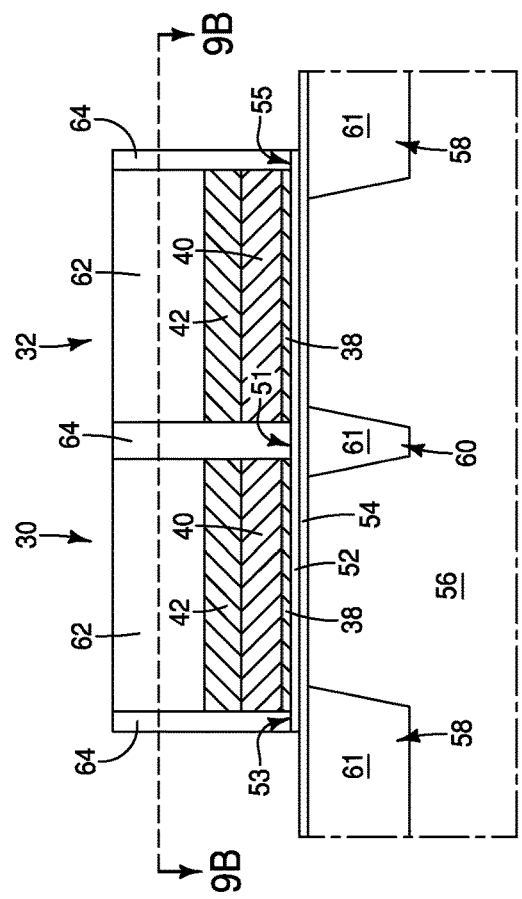
FIG. 9B
FIG. 9A

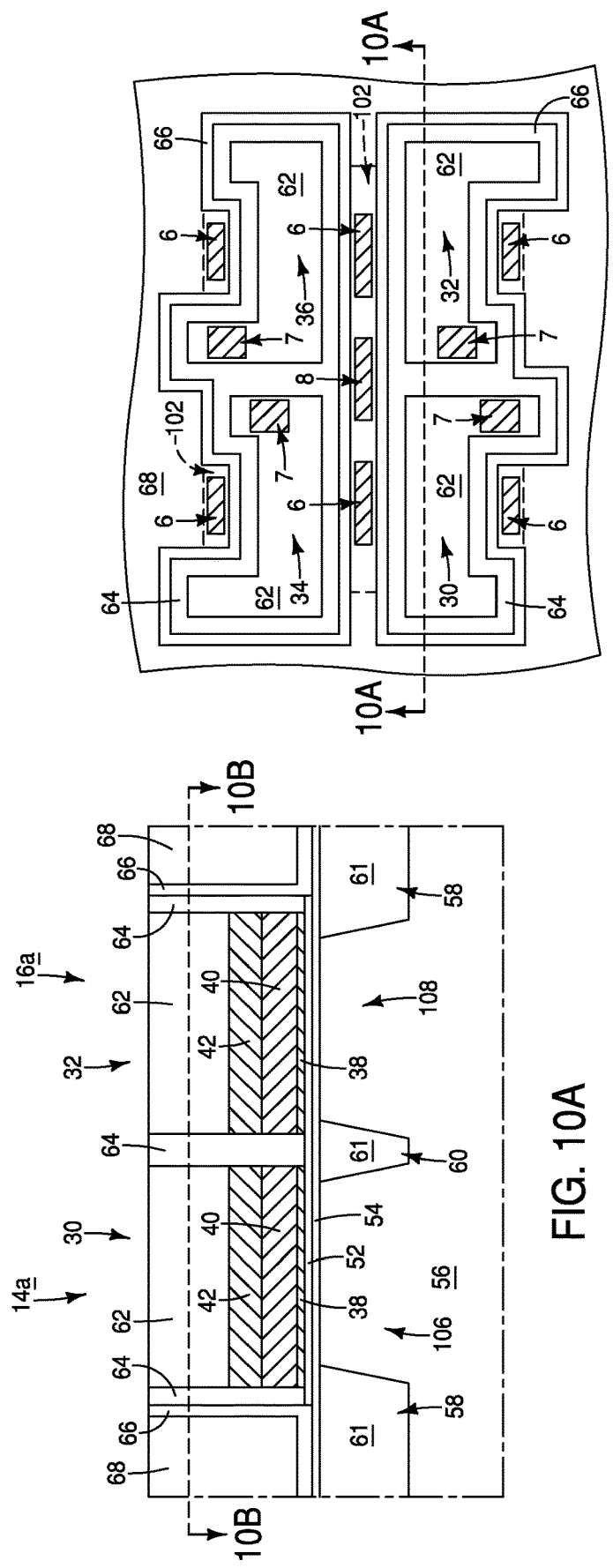

INTEGRATED ASSEMBLIES HAVING CONTINUOUS HIGH-DIELECTRIC FILMS EXTENDING ACROSS CHANNEL REGIONS OF ADJACENT TRANSISTORS

TECHNICAL FIELD

Integrated assemblies having continuous high-dielectric films extending across channel regions of adjacent transistors.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor. An example 1T-1C memory cell 2 is shown in FIG. 1, with the transistor labeled T and the capacitor labeled C. The capacitor has one node coupled with a source/drain region of the transistor, and has another node coupled with a common plate, CP. The common plate may be coupled with any suitable voltage, such as a voltage within a range of from greater than or equal to ground to less than or equal to VCC (i.e., ground-≤CP≤VCC). In some applications, the common plate is at a voltage of about one-half VCC (i.e., about VCC/2). The transistor has a gate coupled to a wordline WL (i.e., access line), and has a source/drain region coupled to a bitline BL (i.e., digit line or sense line). In operation, an electrical field generated by voltage along the wordline may gatedly couple the bitline to the capacitor during read/write operations.

Another prior art 1T-1C memory cell configuration is shown in FIG. 2. The configuration of FIG. 2 shows two memory cells 2a and 2b; with memory cell 2a comprising a transistor T1 and a capacitor C1, and with the memory cell 2b comprising a transistor T2 and a capacitor C2. Wordlines WL0 and WL1 are electrically coupled with the gates of transistors T1 and T2, respectively. A connection to a bitline BL is shared by the memory cells 2a and 2b.

The memory cells described above may be incorporated into memory arrays, and in some applications the memory arrays may have open bitline arrangements. An example integrated assembly 9 having open bitline architecture is shown in FIG. 3. The assembly 9 includes two laterally adjacent memory arrays ("Array 1" and "Array 2"), with each of arrays including memory cells of the type described in FIG. 2 (not labeled in FIG. 3 in order to simplify the drawing). Wordlines WL0-WL7 extend across the arrays, and are coupled with wordline drivers. Digit lines D0-D8 are associated with the first array (Array 1), and digit lines D0*-D8* are associated with the second array (Array 2). Sense amplifiers SA0-SA8 are provided between the first and second arrays. Digit lines at the same height are paired within one another and compared through a sense amplifier (e.g., digit lines D0 and D0* are paired with one another and compared with the sense amplifier SA0). In a read operation, one of the paired digit lines may serve as a reference in determining electrical properties (e.g., voltage) of the other of the paired digit lines.

Each of the sense amplifiers (SA0-SA8) may have a pair of n-channel transistors and a pair of p-channel transistors. It can be desired that the paired n-channel transistors have substantially the same threshold voltage as one another, and it can be desired that the paired p-channel transistors have substantially the same threshold voltage as one another. Such is difficult to achieve with conventional configurations of sense amplifiers, and accordingly it would be desirable to develop improved configurations of sense amplifiers.

BRIEF DESCRIPTION OF THE DRAWINGS

FIGS. 6A and 6B are a diagrammatic cross-sectional side view and a plan view (top-down view) of a region of an integrated assembly at an example process stage of an example method for fabricating example transistors. The view of FIG. 6A is along the line 6A-6A of FIG. 6B. The view of FIG. 6B is along the line 6B-6B of FIG. 6A.

FIGS. 7A and 7B are a diagrammatic cross-sectional side view and a plan view (top-down view) of a region of the integrated assembly of FIGS. 6A and 6B at an example process stage which may follow the process stage of FIGS. 6A and 6B during the example method for fabricating the example transistors. The view of FIG. 7A is along the line 7A-7A of FIG. 7B. The view of FIG. 7B is along the line 7B-7B of FIG. 7A.

FIGS. 9A and 9B are a diagrammatic cross-sectional side view and a plan view (top-down view) of a region of the integrated assembly of FIGS. 6A and 6B at an example process stage which may follow the process stage of FIG. 8 during the example method for fabricating the example transistors. The view of FIG. 9A is along the line 9A-9A of FIG. 9B. The view of FIG. 9B is along the line 9B-9B of FIG. 9A.

FIGS. 10A and 10B are a diagrammatic cross-sectional side view and a plan view (top-down view) of a region of the integrated assembly of FIGS. 6A and 6B at an example process stage which may follow the process stage of FIGS. 9A and 9B during the example method for fabricating the example transistors. The view of FIG. 10A is along the line 10A-10A of FIG. 10B. The view of FIG. 10B is along the line 10B-10B of FIG. 10A.

DETAILED DESCRIPTION OF THE ILLUSTRATED EMBODIMENTS

Some embodiments include integrated assemblies having neighboring transistors, and having a continuous film of high-k dielectric material extending across the channel regions of the neighboring transistors. In some embodiments, the neighboring transistors may be within a sense amplifier. The neighboring transistors may both be PMOS (p-type metal-oxide semiconductor) transistors or may both be NMOS (n-type metal-oxide semiconductor) transistors. In some embodiments, the PMOS transistors may be referred to as p-channel devices (or as pull-up devices); and, in some embodiments, the NMOS transistors may be referred to as n-channel devices (or as pull-down devices).

Example embodiments are described with reference to FIGS. 4-14.

Figure 1:
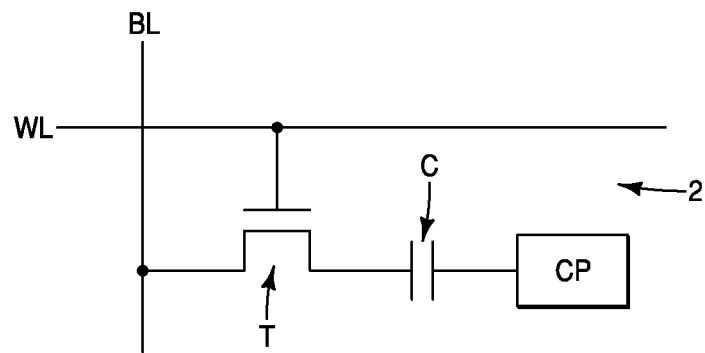
FIG. 1 is a schematic diagram of a prior art memory cell having 1 transistor and 1 capacitor.
Figure 2:
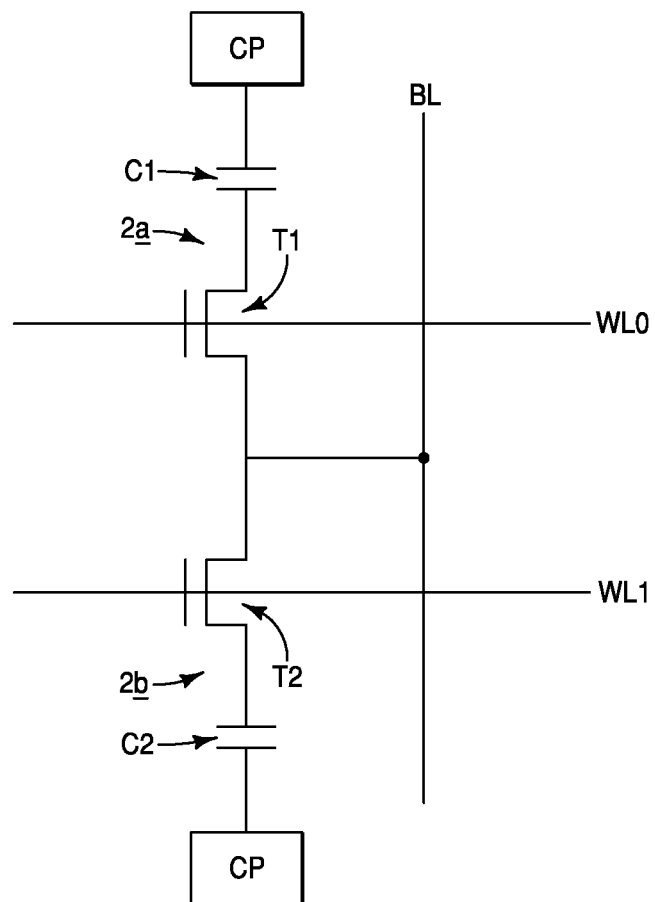
FIG. 2 is a schematic diagram of a pair of prior art memory cells which each have 1 transistor and 1 capacitor, and which share a bitline connection.
Figure 3:
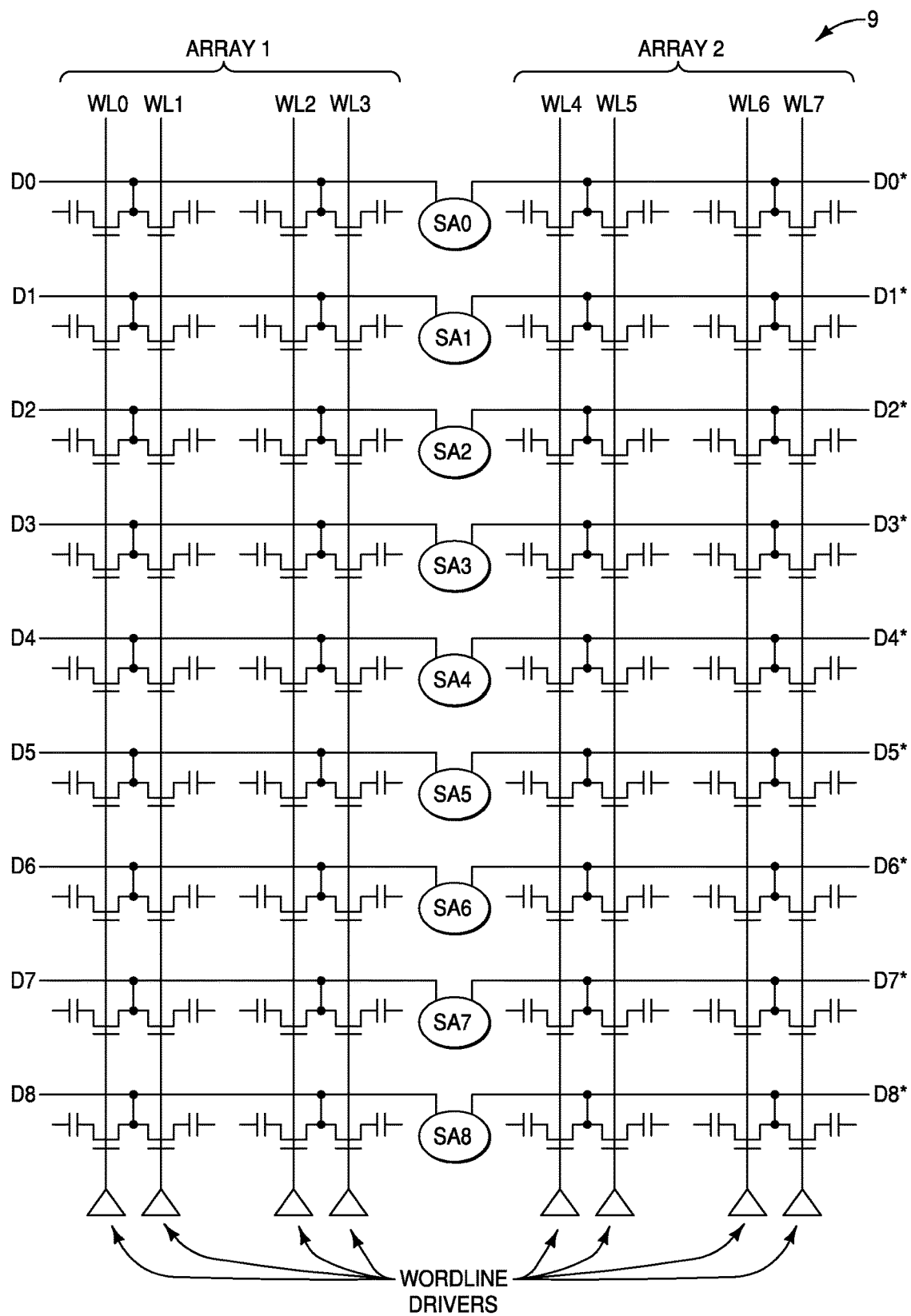
FIG. 3 is a schematic diagram of a prior art integrated assembly having open bitline architecture.
Figure 4:
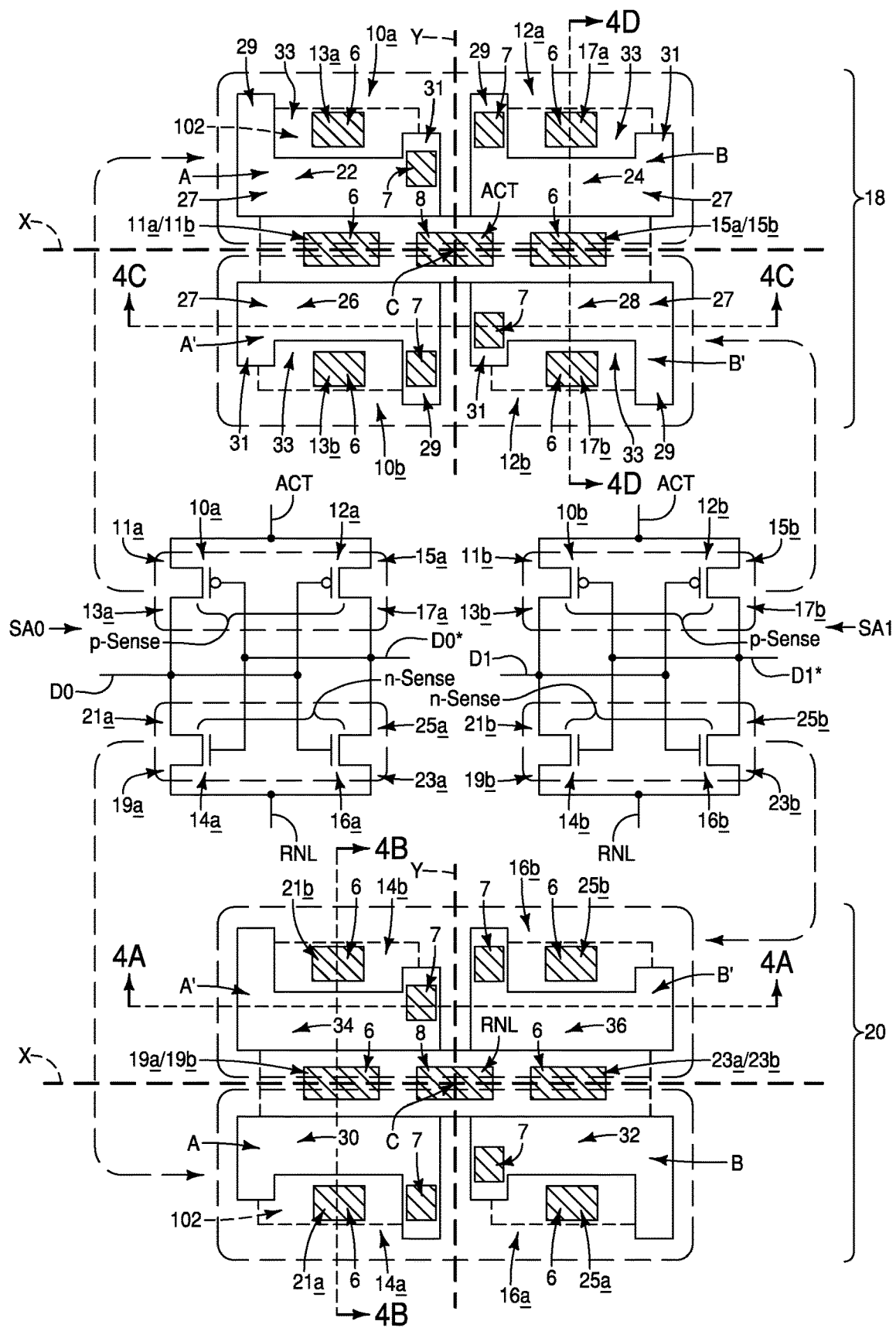
FIG. 4 shows a schematic diagram of a pair of sense amplifiers, and shows plan views (i.e., top-down views) of regions of the sense amplifiers.

Referring to FIG. 4, a pair of sense amplifiers SA0 and SA1 are illustrated. The sense amplifiers may be representative of a large number of substantially identical sense amplifiers associated with memory arrays (e.g., the DRAM arrays described above with reference to FIG. 3); with the term "substantially identical" meaning identical to within reasonable tolerances of fabrication and measurement.

The sense amplifier SA0 comparatively couples a digit line D0 with a digit line D0*, and the sense amplifier SA1 comparatively couples a digit line D1 with a digit line D1*. The digit lines D0 and D1 may be associated with a first memory array (e.g., "Array 1" of FIG. 3), and the digit lines D0* and D1* may be associated with a second memory array (e.g., "Array 2" of FIG. 3). For purposes of understanding this disclosure and the claims that follow, a first digit line is "comparatively coupled" with a second digit line through a sense amplifier if the sense amplifier is configured to compare electrical properties (e.g., voltage) of the first and second digit lines with one another.

The digit lines D0 and D1 may be considered to be representative of a large number of digit lines within a first set of digit lines; with the "first set" corresponding to the digit lines within the first memory array. The digit lines D0* and D1* may be considered to be representative of a large number of digit lines within a second set of digit lines; with the "second set" corresponding to the digit lines within the second memory array.

The sense amplifiers each include a p-sense amplifier (or p-sense component), which is labeled "p-sense", and which comprises a pair of cross-coupled pull-up transistors (i.e., p-channel transistors) 10 and 12. The sense amplifiers also each include an n-sense amplifier (or n-sense component), which is labeled "n-sense", and which comprises a pair of cross-coupled pull-down transistors (i.e., n-channel transistors) 14 and 16. The transistors of the sense amplifier SA0 are labeled 10a, 12a, 14a and 16a, and those of the sense amplifier SA1 are labeled 10b, 12b, 14b and 16b so that the transistors of SA0 may be distinguished from those of SA1.

The p-sense components are coupled with active pull-up circuitry (labeled ACT), and the n-sense components are coupled with a common node (labeled RNL). The common node (RNL) may be alternatively referred to as n-latch circuitry.

The operation of the sense amplifier SA0 utilizes the p-sense and n-sense components to detect the relative signal voltages of D0 and D0*, and to drive the higher signal voltage to VCC while driving the lower signal voltage to ground. The sense amplifier SA1 is operated similarly, but is operated relative to D1 and D1*.

The pull-up transistors 10 have source/drain regions 11 and 13 (with the source/drain regions of the sense amplifier SA0 being labeled 11a and 13a, and with the source/drain regions of the sense amplifier SA1 being labeled 11b and 13b). The source/drain regions 11 are coupled with the active pull-up circuitry (ACT), and the source/drain regions 13 are coupled with a digit line (e.g., D0 or D1).

The pull-up transistors 12 have source/drain regions 15 and 17 (with the source/drain regions of the sense amplifier SA0 being labeled 15a and 17a, and with the source/drain regions of the sense amplifier SA1 being labeled 15b and 17b). The source/drain regions 15 are coupled with the active pull-up circuitry (ACT), and the source/drain regions 17 are coupled with a digit line (e.g., D0* or D1*).

The pull-down transistors 14 have source/drain regions 19 and 21 (with the source/drain regions of the sense amplifier SA0 being labeled 19a and 21a, and with the source/drain regions of the sense amplifier SA1 being labeled 19b and 21b). The source/drain regions 19 are coupled with the common node circuitry (RNL), and the source/drain regions 21 are coupled with a digit line (e.g., D0 or D1).

The pull-down transistors 16 have source/drain regions 23 and 25 (with the source/drain regions of the sense amplifier SA0 being labeled 23a and 25a, and with the source/drain regions of the sense amplifier SA1 being labeled 23b and 25b). The source/drain regions 23 are coupled with the common node circuitry (RNL), and the source/drain regions 25 are coupled with a digit line (e.g., D0* or D1*).

The sense amplifiers SA0 and SA1 may have additional circuitry besides the illustrated circuitry, and may, for example, include inputs and outputs (commonly referred to as I/O), equilibration circuitry, etc.

Some embodiments include improved layouts of the n-sense components and/or the p-sense components. For instance, FIG. 4 shows an example layout 18 relative to the pull-up transistors 10a, 12a, 10b and 12b from the sense amplifiers SA0 and SA1; and shows another example 20 layout relative to the pulldown transistors 14a, 14b, 16a and 16b from the sense amplifiers SA0 and SA1. The layouts 18 and 20 include conductive interconnects 6 extending to the source/drain regions 11, 13, 15, 17, 19, 21, 23 and 25; include conductive interconnects 7 extending to gates of the various transistors; and include conductive interconnects 8 extending to the active pull-up circuitry (ACT) and the common node circuitry (RNL). The layouts 18 and 20 are shown in top-down view and portions of active regions 102 (described below with reference to FIG. 6) are shown in dashed-line (phantom) view to indicate that they are beneath other materials.

Referring first to the layout 18, such may be considered to comprise a set of four transistors (10a, 12a, 10b and 12b); with the transistors 10a and 12a being a first pair of transistors, and with the transistors 10b and 12b being a second pair of transistors. In some embodiments, the first pair of transistors may be considered to comprise an A transistor and a B transistor, and the second pair of transistors may be considered to comprise an A' transistor and a B' transistor. The first pair of transistors (A and B) is laterally disposed from the second pair of transistors (A' and B') across a first axis X. The B and B' transistors are laterally disposed from the A and A' transistors, respectively, across a second axis Y. The second axis Y is substantially orthogonal to the first axis X, with the term "substantially orthogonal" meaning orthogonal to within reasonable tolerances of fabrication and measurement.

The A, B, A' and B' transistors have transistor gates 22, 24, 26 and 28, respectively; which may be referred to as first, second, third and fourth transistor gates. Each of the transistor gates is configured as an open-ended container shape in the top-down view of FIG. 4. Each of the open-ended container shapes has a base region 27, and a pair of leg regions 29 and 31 extending outwardly from the base region. Openings 33 extend into the open ends of the open-ended container shapes, and are between the leg regions 29 and 31. The openings of the open-ended container shapes of the first and second transistors A and B extend in a first direction relative to the first axis X, and the openings of the open-ended container shapes of the third and fourth transistors A' and B' extend in a second direction relative to the first axis X; with the second direction being opposite to the first direction.

The two legs 29 and 31 are of different lengths relative to one another in the embodiment of FIG. 4. In other embodiments (discussed below), the legs may be of about the same length as one another. In embodiments in which one leg (31) is shorter than the other leg (29), the longer leg may be at least about 10% longer than the shorter leg, at least about 50% longer than the shorter leg, at least about twice as long as the shorter leg, etc.

In the shown embodiment of FIG. 4, the short leg (31) of the A transistor is adjacent to the long leg (29) of the B transistor. The gate interconnect 7 associated with the gate 22 of the A transistor is along the short leg of such transistor, and the gate interconnect 7 associated with the gate 24 of the B transistor is along the long leg of such transistor. In some embodiments, the gate interconnect 7 associated with the gate 22 of the A transistor may be referred to as a first interconnect, while the gate interconnect 7 associated with the gate 24 of the B transistor may be referred to as a second interconnect. In the shown embodiment, the first interconnect of the A transistor is offset relative to the second interconnect of the B transistor along the axis Y. Such may alleviate undesired cross-coupling (i.e., noise, gate-hammer-disturbance, etc.) between the interconnects of the A and B transistors during operation of such transistors as compared to other embodiments in which the interconnects of the A and B transistors are physically closer to one another.

In the illustrated embodiment, the layout 18 of the pull-up transistors has a center C through the set of four transistors; with the center C being where the axis X crosses the axis Y. The transistor gates 22, 24, 26 and 28 are substantially identical to one another, and are oriented such that there is C2 rotational symmetry of the transistor gates about the center.

The A transistor (10a) has a first source/drain region 13a within the opening of the open-ended container shape of the first transistor gate 22, and has a second source/drain region 11a in the area between the A transistor and the A' transistor (10b). The B transistor (12a) has a third source/drain region 17a within the opening of the open-ended container shape of the second transistor gate 24, and has a fourth source/drain region 15a in the area between the B transistor and the B' transistor (12b). The A' transistor (10b) has a fifth source/drain region 13b within the opening of the open-ended container shape of the third transistor gate 26, and has a sixth source/drain region 11b coupled with the second source/drain region 11a. The B' transistor (12b) has a seventh source/drain region 17b within the opening of the open-ended container shape of the fourth transistor gate 28, and has an eighth source/drain region 15b coupled with the fourth source/drain region 15a. The second, fourth, sixth and eighth source/drain regions 11a, 11b, 15a and 15b may all be coupled with one another, and may be part of a large source/drain region that extends along the axis X. The illustrated interconnects 6 may extend to segments of such large source/drain region. The active pull-up circuitry ACT may be coupled to the large source/drain region through the interconnect 8. In other embodiments, the source/drain regions 11a, 11b, 15a and 15b may be coupled to one another through any other suitable combination electrically-conductive interconnects and/or overlapping source/drain regions; and the active pull-up circuitry ACT may be coupled with the source/drain regions 11a, 11b, 15a and 15b through any suitable combination of electrically-conductive interconnects and/or overlapping source/drain regions.

The A, B, A' and B' transistors of the layout 18 are p-channel devices; with the A and B transistors being within the first sense amplifier SA0, and with the A' and B' transistors being within the second sense amplifier SA1. The layout 20 may be considered to comprise A, B, A' and B' transistors analogous to those described relative to the layout 18, except that the transistors are n-channel devices. The A, B, A' and B' transistors of the layout 20 are shown to have transistor gates 30, 32, 34 and 36, respectively; which may be referred to as first, second, third and fourth transistor gates. Each of the transistor gates is configured as an open-ended container shape analogous to the open-ended container shapes described with reference to the layout 18. The layout 20 may be oriented relative to an axis X and an axis Y analogous to the axes described above relative to the layout 18.

In the layout 20, the A transistor (14a) has a first source/drain region 21a within the opening of the open-ended container shape of the first transistor gate 30, and has a second source/drain region 19a in the area between the A transistor and the A' transistor (14b). The B transistor (16a) has a third source/drain region 25a within the opening of the open-ended container shape of the second transistor gate 32, and has a fourth source/drain region 23a in the area between the B transistor and the B' transistor (16b). The A' transistor (14b) has a fifth source/drain region 21b within the opening of the open-ended container shape of the third transistor gate 34, and has a sixth source/drain region 19b coupled with the second source/drain region 19a. The B' transistor (16b) has a seventh source/drain region 25b within the opening of the open-ended container shape of the fourth transistor gate 36, and has an eighth source/drain region 23b coupled with the fourth source/drain region 23a. The second, fourth, sixth and eighth source/drain regions 19a, 19b, 23a and 23b may all be coupled with one another, and may be part of a large source/drain region that extends along the axis X. The illustrated interconnects 6 may extend to segments of such large source/drain region. The common node circuitry RNL may be coupled to the large source/drain region through the interconnect 8. In other embodiments, the source/drain regions 19a, 19b, 23a and 23b may be coupled to one another through any other suitable combination electrically-conductive interconnects and/or overlapping source/drain regions; and the RNL circuitry may be coupled with the source/drain regions 19a, 19b, 23a and 23b through any suitable combination of electrically-conductive interconnects and/or overlapping source/drain regions.

The embodiment of FIG. 4 shows the p-channel transistors (10 and 12) in a layout 18 which is on an opposite side of the sense amplifiers (SA0 and SA1) from the layout 20 comprising n-channel transistors (14 and 16). In other embodiments, the layouts 18 and 20 (i.e., the layouts comprising the p-channel transistors and the n-channel transistors, respectively) may be on the same side of the sense amplifiers as one another. The p-channel transistors and n-channel transistors may be arranged in p-sense banks and n-sense banks as described below. The p-sense banks may be in any suitable location relative to the n-sense banks; and may, for example, be laterally offset from the n-sense banks, vertically offset from the n-sense banks, intermingled with the n-sense banks, etc.

The transistors of FIG. 4 may have any suitable configurations. FIGS. 4A-4D show cross-sections along the lines 4A-4A, 4B-4B, 4C-4C and 4D-4D of FIG. 4, and illustrate example configurations of the transistors.

Figure 4A:
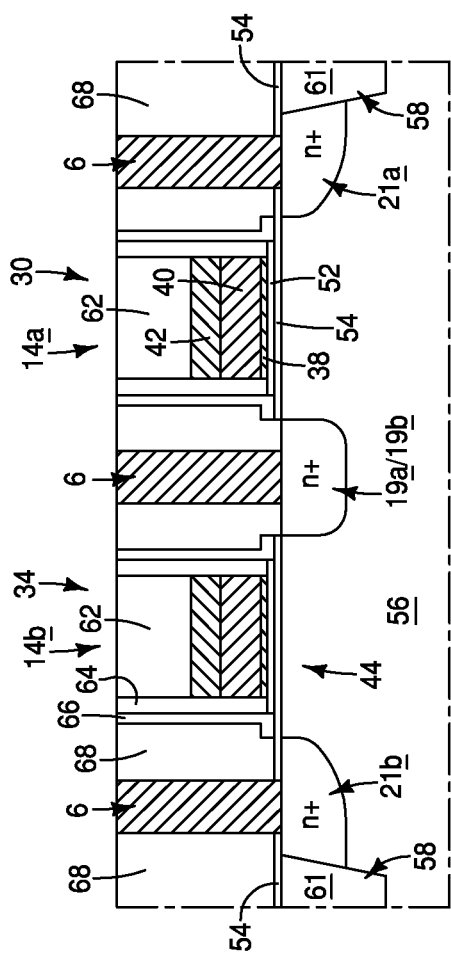
FIGS. 4A-4D are diagrammatic cross-sectional side views along the lines 4A-4A, 4B-4B, 4C-4C and 4D-4D of FIG. 4, respectively.

Referring to FIG. 4A, the n-channel transistors 14b and 16b may be considered to be first and second transistors, respectively, which are adjacent to one another. The first transistor 14b has the transistor gate 34, and the second transistor 16b has the transistor gate 36. The transistor gates 34 and 36 include conductive gate materials 38, 40 and 42. Such conductive gate materials may correspond to any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the materials 38, 40 and 42 may correspond to a first metal-containing material, a doped semiconductor material, and a second metal-containing material, respectively. The first metal-containing material 38 may comprise, for example, titanium nitride; the doped semiconductor material 40 may comprise, for example, conductively-doped silicon; and the second metal-containing material 42 may comprise, for example, tungsten. In some embodiments, the conductive gate materials of the first transistor gate 34 may be considered to correspond to first conductive gate materials, and the conductive gate materials of the second transistor gate 36 may be considered to correspond to second conductive gate materials.

In the shown embodiment, insulative capping material 62 is provided over the conductive material 42 of the transistor gates. The insulative capping material may comprise any suitable composition(s); and in some embodiments may comprise, consist essentially of, or consist of silicon nitride.

The first transistor 14b has a channel region 44 under the transistor gate 34, and the second transistor 16b has a channel region 46 under the transistor gate 36. A first insulative region 48 is between the channel region 44 and the transistor gate 34 of the first transistor 14b, and a second insulative region 50 is between the channel region 46 and the transistor gate 36 of the second transistor 16b. A dielectric film 52 extends across the first and second insulative regions 48 and 50. The dielectric film 52 is continuous across the first and second insulative regions, and in some embodiments may comprise high-k dielectric material (with the term high-k meaning a dielectric constant greater than that of silicon dioxide); and accordingly may be referred to as a continuous high-k dielectric film which extends across both of the first and second insulative regions 48 and 50. The high-k dielectric film 52 may comprise any suitable composition(s); and in some embodiments may comprise, consist essentially of, or consist of one or more of aluminum oxide, tantalum oxide, hafnium oxide, zirconium oxide, etc. The dielectric film 52 may be formed to any suitable thickness; and in some embodiments may be formed to a thickness within a range of from about 10 angstroms (Å) to about 100 nm.

An advantage of having the continuous high-k dielectric material extending across both of the n-channel transistors 14b and 16b is that such may enable better matching of threshold voltage across the transistors 14b and 16b than can be achieved without the continuous high-k dielectric material. For instance, a problem with conventional sense amplifier configurations can be that the paired n-sense transistors (or paired p-sense transistors) will each have a separate dielectric layer relative to the other. Oxygen and/or other oxidant may diffuse into the dielectric layers and alter one or more performance characteristics (e.g., threshold voltage) of one of the paired n-sense transistors (or paired p-sense transistors) relative to the other. Such may problematically impact the performance of a sense amplifier, and may even render the sense amplifier inoperable for some applications in that the sense amplifier will have performance characteristics outside of desired tolerances. The continuous film 52 shown in the embodiment of FIG. 4A enables both of the n-sense transistors 14b and 16b to share the high-k dielectric material 52, and thus enables performance characteristics of the paired n-sense transistors 14b and 16b to remain matched. A similar configuration may also be formed relative to the paired p-sense transistors 10b and 12b, as shown in FIG. 4C. Accordingly, configurations of the present invention may enable problems associated with conventional sense amplifiers to be avoided. Thus, sense amplifiers configured in accordance with the present invention may have improved performance characteristics relative to conventional sense amplifiers.

The illustrated dielectric regions 48 and 50 also comprise an additional insulative material 54 under the film 52. Such additional insulative material may be referred to as an underlying insulative material. The underlying insulative material 54 may comprise any suitable composition(s); and in some embodiments may comprise, consist essentially of, or consist of silicon and oxygen (e.g., silicon dioxide), or silicon, oxygen and nitrogen (e.g., silicon oxynitride).

The channel regions 44 and 46 extend into a base material 56. The base material may comprise semiconductor material; and may, for example, comprise, consist essentially of, or consist of monocrystalline silicon. The base material may be referred to as a semiconductor base, or as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Isolation regions 58 and 60 extend into the base material 56. Such isolation regions comprise isolation material 61. The isolation material 61 may comprise any suitable insulative composition(s); and in some embodiments may comprise one or both of silicon dioxide and silicon nitride. The isolation regions may correspond to shallow trench isolation (STI) in some embodiments. The isolation region 60 separates the first and second channel regions 44 and 46 from one another along the illustrated cross-section of FIG. 4A. The isolation region 58 extends entirely around an outer periphery of the transistors 14b and 16b.

The transistor gate 34 is laterally-spaced from the transistor gate 36 along the cross-section of FIG. 4A, and an insulative material 64 is between the transistor gates 34 and 36. The insulative material 64 isolates the conductive gate material of transistor 14b (i.e., the first conductive gate material) from the conductive gate material of transistor 16b (i.e., the second conductive gate material). The insulative material 64 may comprise any suitable composition(s); and in some embodiments may comprise, consist essentially of, or consist of one or both of silicon dioxide and silicon nitride.

The insulative material 64 between the gates 34 and 36 may be considered to be an intervening region 69 of the insulative material 64; with the intervening region 69 separating the gates 34 and 36 from one another. The insulative material 64 within the intervening region 69 may be referred to as intervening insulative material. Such intervening insulative material is directly against an upper surface of the film 52 of high-k dielectric material. In some embodiments, a segment 51 of the film 52 may be considered to be directly between the intervening insulative material and the isolation material 61 within the isolation region 60.

In some embodiments, the transistor gate 34 may be considered to have a first outer periphery 63, and the transistor gate 36 may be considered to have a second outer periphery 65. The insulative material 64 surrounds the first and second outer peripheries, and is on segments 51, 53 and 55 of the high-k dielectric film. The intervening portion of the insulative material 64 is between the gates 34 and 36, and may be considered to be along inner portions of the outer peripheries (with such inner portions being understood to be laterally between the first and second transistor gates 34 and 36). Other portions of the insulative material 64 are along outer portions of the outer peripheries 63 and 65, with the outer portions being understood to be portions of the peripheries 63 and 65 which are not laterally between the first and second transistor gates 34 and 36. Another insulative material 66 surrounds the outer portions of the first and second outer peripheries 63 and 65. The insulative materials 64 and 66 may be referred to as first and second insulative materials to distinguish them from one another. The second insulative material 66 may comprise a different composition than the first insulative material 64. In some embodiments, the materials 64 and 66 comprise silicon dioxide and silicon nitride, respectively.

In the embodiment of FIG. 4A, a third insulative material 68 is outward of the second insulative material 66, and surrounds the outer portions of the first and second outer peripheries 63 and 65. The third insulative material 68 may comprise any suitable composition(s), and in some embodiments comprises silicon dioxide.

Figure 4B:
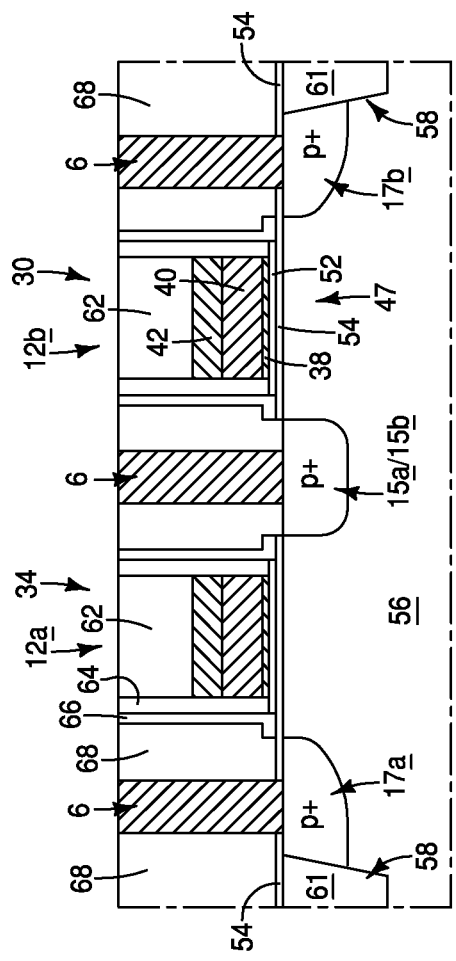
Figure 4C:
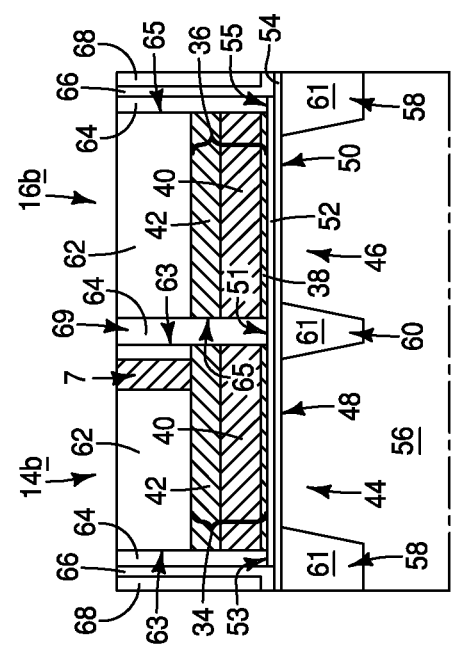

FIG. 4B shows a cross-section through the transistors 14a and 14b. The source/drain regions 19a/19b, 21a and 21b are shown to be n-type doped regions (and specifically are shown to be heavily n-type doped utilizing the symbol "n+") of the n-channel devices 14a and 14b.

Figure 4D:
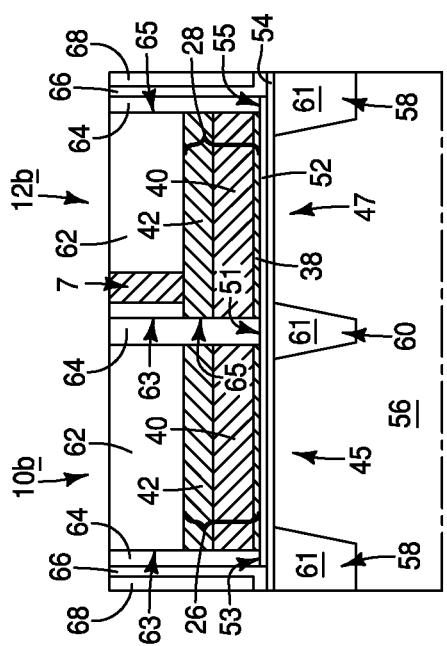

FIGS. 4C and 4D show cross-sections through p-channel devices (i.e., p-channel transistors) 10b, 12b and 12a, and show that the p-channel devices may have configurations analogous to those described above relative to the n-channel devices (i.e., n-channel transistors).

In some embodiments, the configuration of FIG. 4A may be considered to show a first continuous high-k dielectric film 52 extending across first and second channel regions of first and second transistors 14b and 16b; with the high-k dielectric film being disposed between the transistor gates of the first and second transistors and the channel regions of the first and second transistors. The configuration of FIG. 4C may be considered to show a second continuous high-k dielectric film 52 extending across third and fourth channel regions (45 and 47) of third and fourth transistors 10b and 12b; with the second high-k dielectric film being disposed between the transistor gates of the third and fourth transistors and the channel regions of the third and fourth transistors. The first and second transistors 14b and 16b are n-channel devices, and the third and fourth transistors 10b and 12b are p-channel devices.

Figure 5:
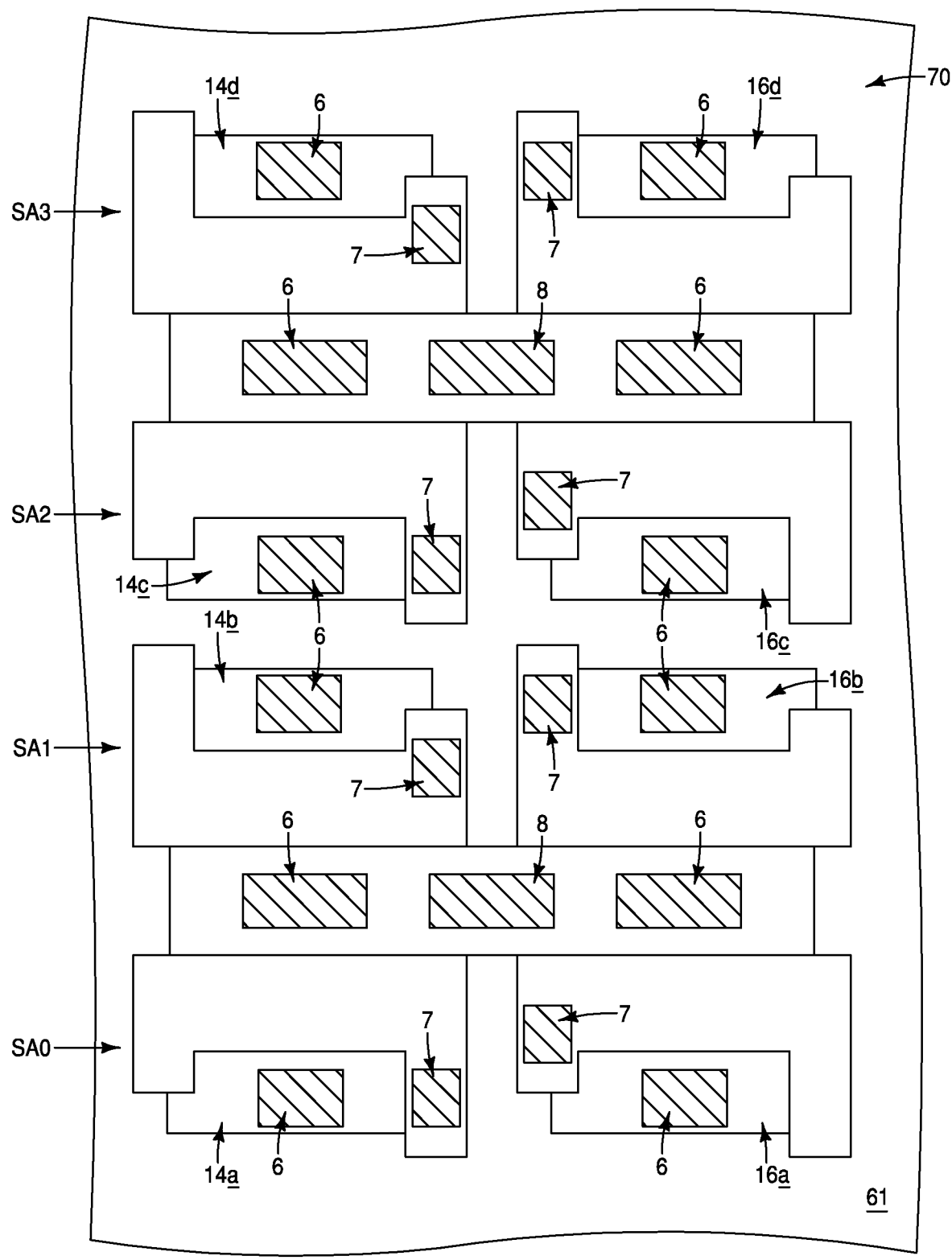
FIG. 5 is a plan view (i.e., top-down view) of a region of an integrated assembly having an example arrangement of transistors.

In some embodiments, the n-sense components and p-sense components may be provided within banks. For instance, FIG. 5 shows a bank 70 comprising n-sense components from four sense amplifiers SA0, SA1, SA2 and SA3. The n-sense components of SA0 and SA1 comprise the transistors 14a, 16a, 14b and 16b which are shown and described with reference to FIG. 4. The sense amplifiers SA1 and SA2 comprise analogous transistors 14c, 16c, 14d and 16d. Although the illustrated bank comprises eight transistors, it is to be understood that the bank may comprise a much larger number of transistors depending on the number of sense amplifiers utilized in an integrated assembly. The bank may comprise n-sense components, p-sense components, or a combination of n-sense components and p-sense components.

The transistors described above may be formed with any suitable processing. Example processing is described with reference to FIGS. 6A, 6B, 7A, 7B, 8, 9A, 9B, 10A and 10B.

Referring to FIG. 6B, a portion of an integrated assembly 100 is shown in plan view. The assembly includes an active region 102, and includes isolation material 61 extending around the active region. The active region is H-shaped. Portions of the isolation material 61 are identified as regions 60 extending into cavities of the H-shape, and the remainder of the isolation material 61 is identified as a region 58.

FIG. 6A shows that the materials 54, 52, 38, 40, 42 and 62 are formed over the active region 102 and the isolation material 61.

Referring to FIGS. 7A and 7B, the materials 38, 40, 42 and 62 are patterned into the transistor gates 30, 32, 34 and 36. The active region 102 is shown in dashed line view in FIG. 7B to indicate that it is beneath the material 52 in the shown view.

Figure 8:
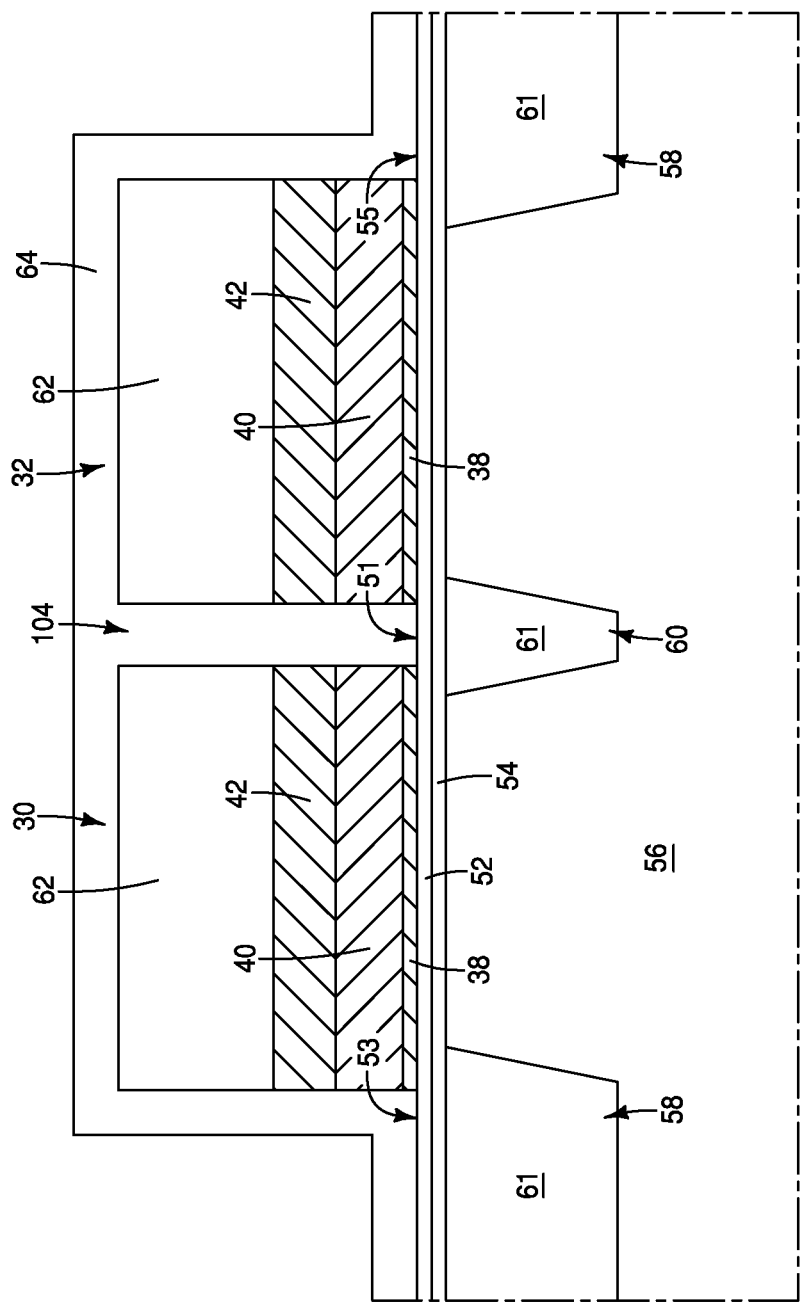
FIG. 8 is a diagrammatic cross-sectional side view of a region of the integrated assembly of FIGS. 6A and 6B at an example process stage which may follow the process stage of FIGS. 7A and 7B during the example method for fabricating the example transistors.

Referring to FIG. 8, the insulative material 64 is deposited conformally over the transistor gates 30, 32, 34 and 36 (with the gates 30 and 32 being shown in FIG. 8), and along sidewalls of the transistor gates. The insulative material 64 is deposited as a thick enough layer so that it entirely fills a gap 104 between the transistor gates 30 and 32 to cover the segment 51 of the high-k dielectric material 52 exposed within such gap. If the insulative material 64 is not formed thick enough to entirely fill the gap 104, then some of the high-k material 52 may be etched at a later process stage (shown in FIGS. 9A and 9B), which will lead to the material 52 not being a continuous film across the transistors 30 and 32. In the shown embodiment, the segment 51 of the high-k material 52 is fully protected by the material 64. The material 64 also protects segments 53 and 55 of the high-k material 52. It is noted that the segments 51, 53 and 55 are part of a continuous expanse of the high-k material 52 as can be understood with reference to the view of FIG. 7B.

Referring to FIGS. 9A and 9B, the material 64 is etched back to leave portions of the material remaining along sidewalls of the transistor gates 30, 32, 34 and 36. The spacing D between adjacent gates (e.g., gates 34 and 36) may be tailored to enable the entire segment 51 of the high-k material 52 to remain covered and protected by the material 64. However, in some embodiments it may be acceptable to leave some portion of the segment 51 unprotected, in which case the spacing D may be increased.

After the material 64 is etched, exposed regions of the high-k material 52 may be removed. Such may be accomplished with a same etch utilized to remove material 64 or with a different etch. In some embodiments, the etch utilized to remove the exposed regions of material 52 is a wet etch.

Referring to FIGS. 10A and 10B, the materials 66 and 68 are formed along outer sidewalls of the transistor gates. Also, the interconnects 6 and 8 are formed to extend through the insulative material 68, and the interconnects 7 are formed to extend through the insulative material 62.

In some embodiments, the configuration of FIG. 10A may be considered to show a first continuous high-k dielectric film 52 extending across the first and second channel regions of the first and second transistors 14a and 16a; with the high-k dielectric film being disposed between the transistor gates of the first and second transistors and channel regions 106 and 108 of the first and second transistors. The configuration of FIG. 4A may be considered to show a second continuous high-k dielectric film 52 extending across the third and fourth channel regions 44 and 46 of the third and fourth transistors 14b and 16b; with the second high-k dielectric film being disposed between the transistor gates of the third and fourth transistors and the channel regions of the third and fourth transistors.

Figure 11:
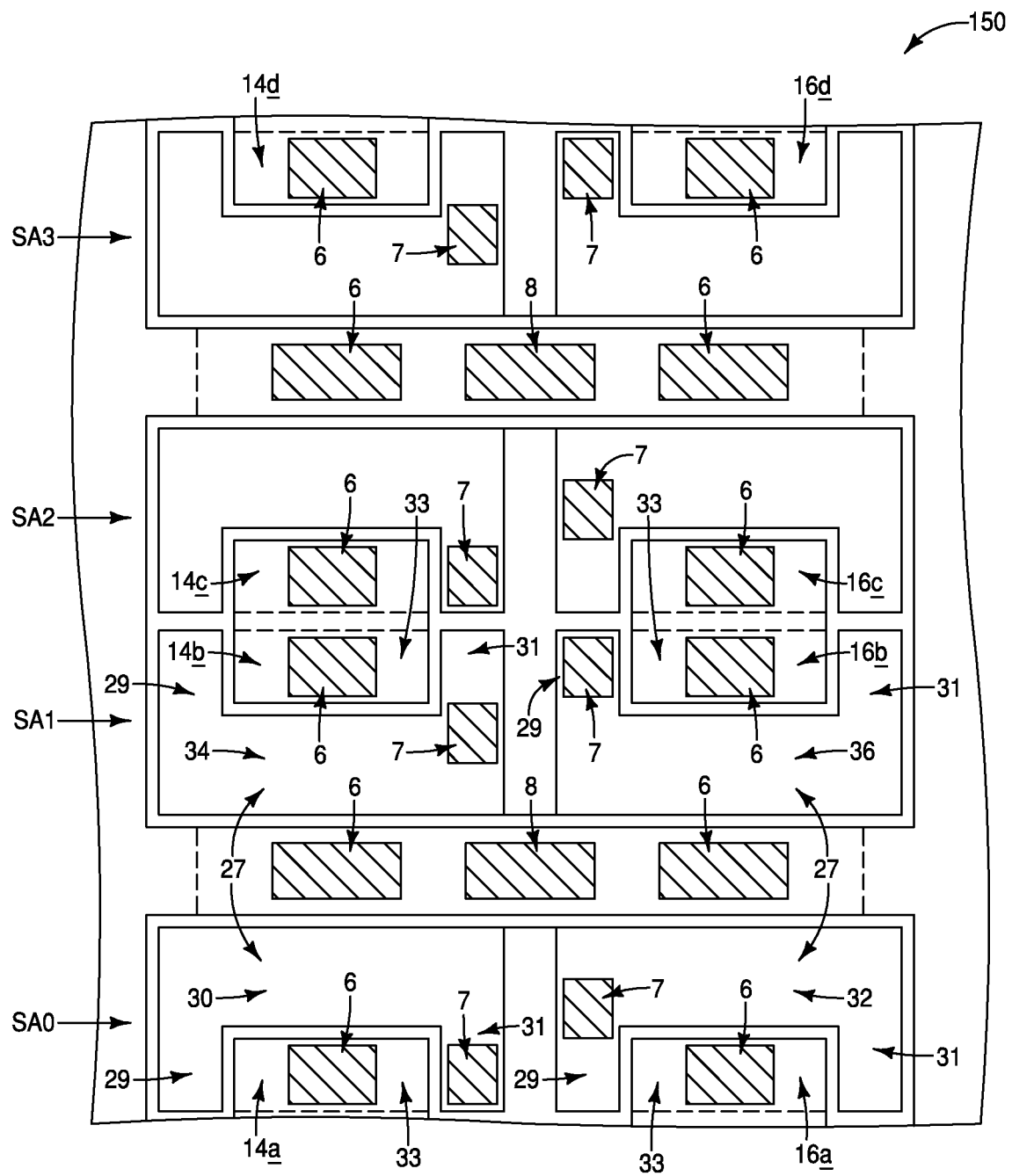
FIG. 11 is a plan view (i.e., top-down view) of a region of an integrated assembly having an arrangement of transistors.

FIG. 4 shows an embodiment in which the transistor gates are configured as open-ended container shapes in top-down view, with the container shapes having paired leg regions of different lengths relative to one another. In other embodiments, the paired leg regions may be of about the same length as one another. FIG. 11 shows a region of an integrated assembly 150 having a plurality of transistors 14a, 16a, 14b, 16b, 14c, 16c, 14d and 16d analogous to those of FIGS. 4 and 5. Each of transistors has a gate, with the gates 30, 32, 34 and 36 being labeled. The gates have open-ended container shapes with a base region 27, and a pair of leg regions 29 and 31 extending outwardly from the base region. Openings 33 extend into the open ends of the open-ended container shapes, and are between the leg regions 29 and 31.

The two legs 29 and 31 are of about the same length as one another (with the term "about the same" meaning the same to within reasonable tolerances of fabrication and measurement).

In the shown embodiment of FIG. 11, adjacent gate interconnects 7 are offset relative to one another similar to the embodiment described above with reference to FIG. 4. Such may alleviate undesired cross-coupling (i.e., noise, gate-hammer-disturbance, etc.) between adjacent gate interconnects during operation of adjacent transistors.

The gate structures of FIG. 11 may be formed with any suitable processing. Example processing is described with reference to FIGS. 12-14.

Figure 12:
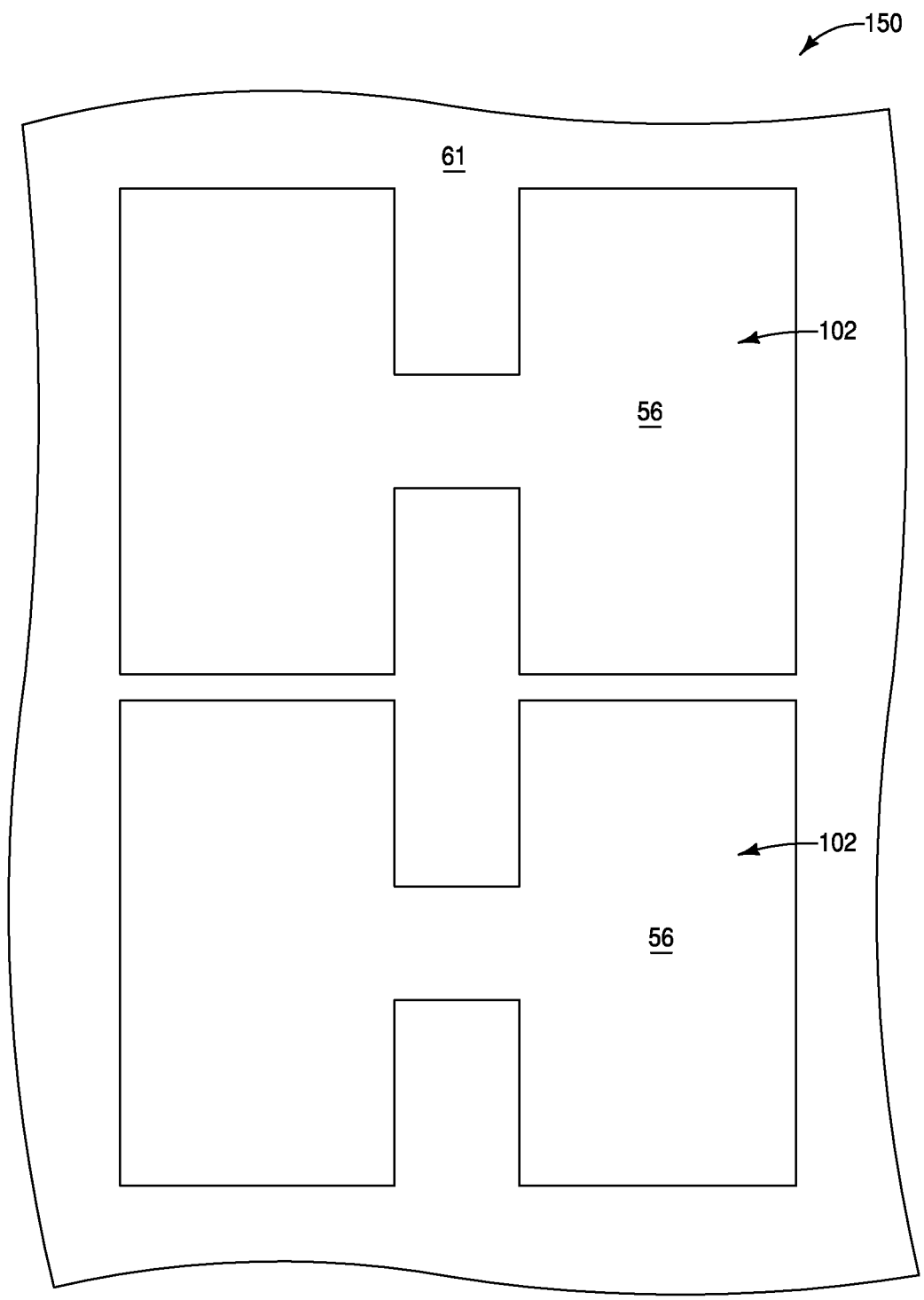
FIG. 12 is a diagrammatic plan view (top-down view) of a region of an integrated assembly at an example process stage of an example method for fabricating example transistors of the type shown in FIG. 11.

Referring to FIG. 12, a portion of the integrated assembly 150 is shown in plan view at an example process stage during fabrication of the example transistor structures of FIG. 11. The assembly includes active regions 102, and includes isolation material 61 extending around the active regions. The active regions are H-shaped.

Figure 13:
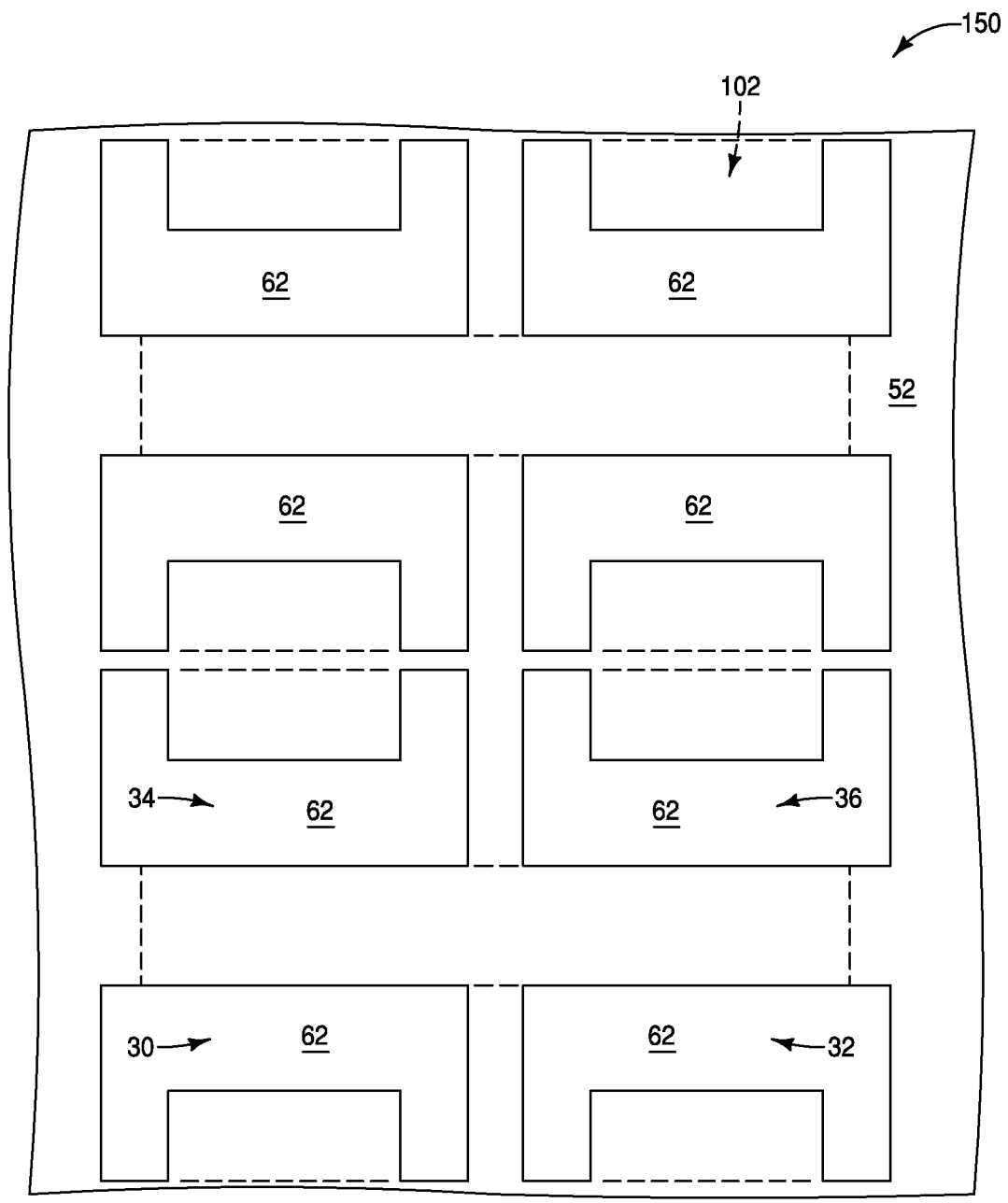
FIG. 13 is a diagrammatic plan view (top-down view) of a region of the integrated assembly of FIG. 12 at an example process stage which may follow the process stage of FIG. 12 during the example method for fabricating the example transistors of the type shown in FIG. 11.

Referring to FIG. 13, the assembly 150 is shown at process stage analogous to that described above with reference to FIGS. 7A and 7B. The gate structures are formed, with some of the gate structures being labeled as 30, 32, 34 and 36.

Figure 14:
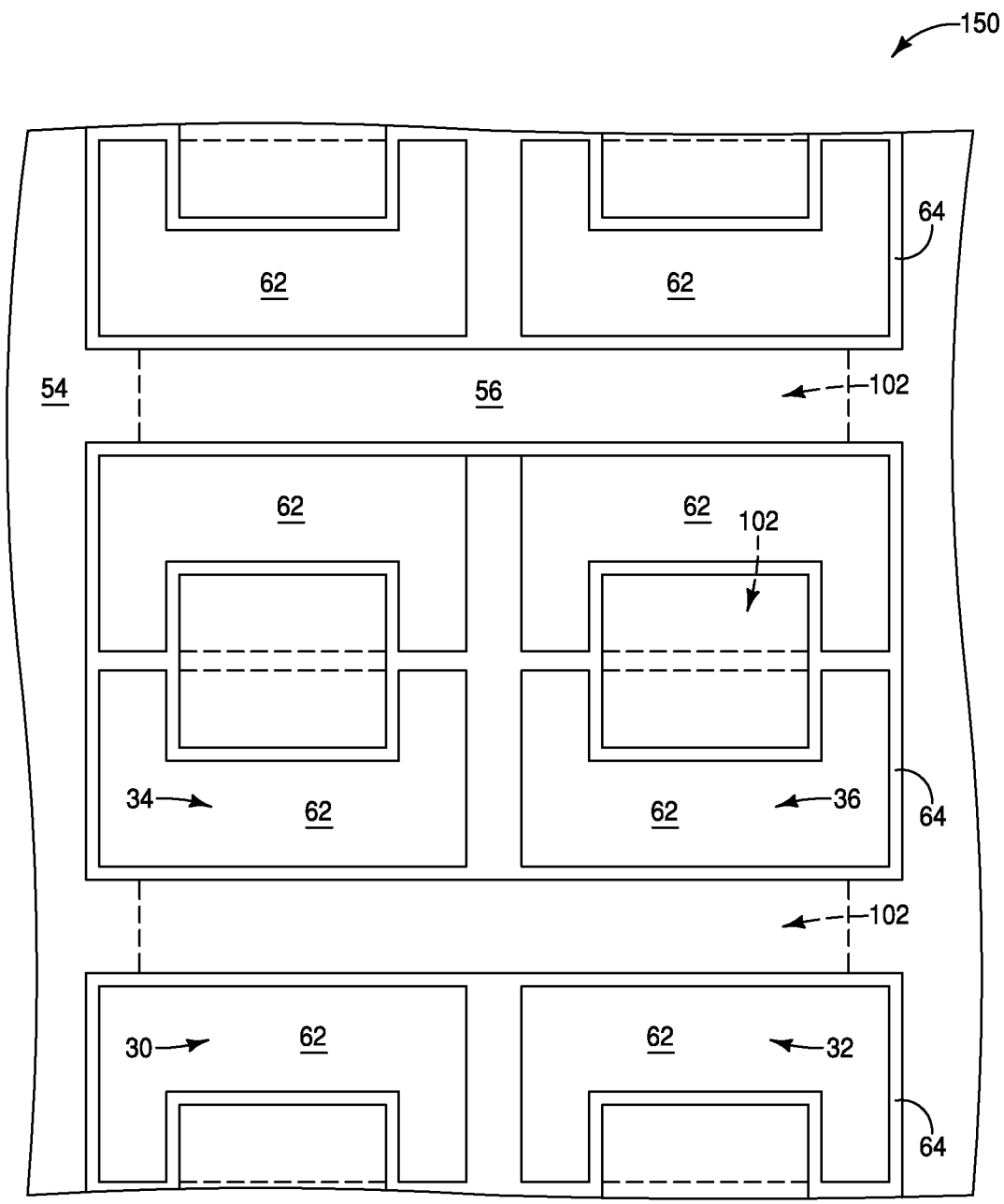
FIG. 14 is a diagrammatic plan view (top-down view) of a region of the integrated assembly of FIG. 12 at an example process stage which may follow the process stage of FIG. 13 during the example method for fabricating the example transistors of the type shown in FIG. 11.

Referring to FIG. 14, the assembly 150 is shown at process stage analogous to that described above with reference to FIGS. 9A and 9B. The insulative material 64 is formed and patterned, and is utilized as a mask to pattern the high-k dielectric material 52 (shown in FIGS. 9A and 9B). Subsequently, additional processing analogous to that described above with FIG. 10 may be utilized to complete the structures shown in FIG. 11.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first transistor adjacent to a second transistor. The first transistor has a first conductive gate material over a first insulative region, and the second transistor has a second conductive gate material over a second insulative region. A continuous high-k dielectric film extends across both of the first and second insulative regions.

Some embodiments include an integrated assembly comprising a set of four transistors. The set includes a first pair of transistors and a second pair of transistors. The first pair of transistors are laterally disposed from the second pair of transistors across a first axis. The transistors of the first pair are an A transistor and a B transistor. The B transistor is laterally disposed from the A transistor across a second axis which is substantially orthogonal to the first axis. The transistors of the second pair are an A' transistor and a B' transistor. The B' transistor is laterally disposed from the A' transistor across the second axis. The A, B, A' and B' transistors have first, second, third and fourth transistor gates, respectively. Each of the first, second, third and fourth transistor gates, in top-down view, is configured as an open-ended container shape. Each open-ended container shape has a base region and two leg regions extending outwardly from the base region, and has an opening extending into the open-end. The openings of the open-ended container shapes of the first and second transistor gates extend in a first direction relative to the first axis, and the openings of the open-ended container shapes of the third and fourth transistor gates extend in a second direction relative to the first axis. The second direction is opposite to the first direction. The A, B, A' and B' transistors have first, second, third and channel regions, respectively. The first channel region is beneath the first transistor gate, the second channel region is beneath the second transistor gate, the third channel region is beneath the third transistor gate, and the fourth channel region is beneath the fourth transistor gate. A first continuous high-k dielectric film extends across both the first and second channel regions and is disposed between the first and second transistor gates and the first and second channel regions. A second continuous high-k dielectric film extends across both the third and fourth channel regions and is disposed between the third and fourth transistor gates and the third and fourth channel regions.

Some embodiments include an integrated assembly comprising a first memory array having a first set of digit lines, a second memory array having a second set of digit lines, and a plurality of sense amplifiers. Each of the sense amplifiers being configured to comparatively couple a digit from the first set with a digit line from the second set. Each of the sense amplifiers includes a first transistor adjacent to a second transistor. The first transistor has a first conductive gate material over a first insulative region. The second transistor has a second conductive gate material over a second insulative region. A continuous high-k dielectric film extends across both of the first and second insulative regions.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a first transistor adjacent to a second transistor, the first transistor having a first conductive gate material over a first insulative region, the second transistor having a second conductive gate material over a second insulative region;
a continuous high-k dielectric film extending across both the first and second insulative regions; and
wherein:
the first and second conductive gate materials include a first metal-containing material over the continuous high-k dielectric film, a doped semiconductor material over the first metal-containing material, and a second metal-containing material over the doped semiconductor material;
the first metal-containing material comprises titanium nitride;
the doped semiconductor material comprises silicon; and
the second metal-containing material comprises tungsten.

2. An integrated assembly, comprising:
a first transistor adjacent to a second transistor, the first transistor having a first conductive gate material over a first insulative region, the second transistor having a second conductive gate material over a second insulative region;
a continuous high-k dielectric film extending across both the first and second insulative regions; and
wherein:
the first conductive gate material is configured as a first transistor gate;
the second conductive gate material is configured as a second transistor gate;
the first transistor gate in top-down view is configured as a first open-ended container shape, said first open-ended container shape having a base region and two leg regions extending outwardly from the base region; and
the second transistor gate in top-down view is configured as a second open-ended container shape, with said second open-ended container shape being substantially identical to the first open-ended container shape.

3. The integrated assembly of claim 2 wherein both of said two leg regions of the first open-ended container shape are of about the same length.

4. The integrated assembly of claim 2 wherein one of said two leg regions of the first open-ended container shape is shorter than the other of said two leg regions of the first open-ended container shape.

5. An integrated assembly, comprising:
a first transistor adjacent to a second transistor, the first transistor having a first conductive gate material over a first insulative region, the second transistor having a second conductive gate material over a second insulative region;
a continuous high-k dielectric film extending across both the first and second insulative regions; and
wherein:
the first conductive gate material is configured as a first transistor gate having a first outer periphery;
the second conductive gate material is configured as a second transistor gate having a second outer periphery;
a first insulative material surrounds the first and second outer peripheries and is on segments of the continuous high-k dielectric film;

the first and second outer peripheries comprise inner portions which are laterally between the first and second transistor gates, and comprise outer portions which are not laterally between the first and second transistor gates; and a second insulative material surrounds the outer portions of the first and second outer peripheries; the second insulative material being compositionally different from the first insulative material.

6. The integrated assembly of claim 5 wherein the first insulative material comprises silicon dioxide, and wherein the second insulative material comprises silicon nitride.

7. The integrated assembly of claim 6 further comprising a third insulative material outward of the second insulative material and surrounding the outer portions of the first and second outer peripheries.

8. The integrated assembly of claim 7 wherein the third insulative material comprises silicon dioxide.

9. An integrated assembly, comprising:

a set of four transistors; said set including a first pair of transistors and a second pair of transistors; the first pair of transistors being laterally disposed from the second pair of transistors across a first axis; the transistors of the first pair being an A transistor and a B transistor; the B transistor being laterally disposed from the A transistor across a second axis which is substantially orthogonal to the first axis; the transistors of the second pair being an A' transistor and a B' transistor; the B' transistor being laterally disposed from the A' transistor across the second axis; the A, B, A' and B' transistors having first, second, third and fourth transistor gates, respectively; each of the first, second, third and fourth transistor gates, in top-down view, being configured as an open-ended container shape; each of the open-ended container shapes having a base region and two leg regions extending outwardly from the base region, and having an opening extending into the open-end; the openings of open-ended container shapes of the first and second transistor gates extending in a first direction relative to the first axis, and the openings of the open-ended container shapes of the third and fourth transistor gates extending in a second direction relative to the first axis, with the second direction being opposite to the first direction; the A, B, A' and B' transistors having first, second, third and channel regions, respectively; the first channel region being beneath the first transistor gate, the second channel region being beneath the second transistor gate, the third channel region being beneath the third transistor gate, and the fourth channel region being beneath the fourth transistor gate;

a first continuous high-k dielectric film extending across both the first and second channel regions and being disposed between the first and second transistor gates and the first and second channel regions; and a second continuous high-k dielectric film extending across both the third and fourth channel regions and being disposed between the third and fourth transistor gates and the third and fourth channel regions.

10. The integrated assembly of claim 9 having a center through the set of four transistors where the first axis crosses the second axis, and wherein the transistor gates are oriented such that there is C2 rotational symmetry of the transistor gates about the center.

11. The integrated assembly of claim 9 wherein the two leg regions of each of said open-ended container shapes are of different lengths relative to one another.

12. The integrated assembly of claim 11 wherein a short leg region of the A transistor is adjacent to a long leg region of the B transistor.

13. The integrated assembly of claim 12 wherein:

a first interconnect couples to the short leg region of the A transistor;

a second interconnect couples to the long leg region of the B transistor; and the first interconnect is offset relative to the second interconnect along the first direction.

14. The integrated assembly of claim 9 wherein the two leg regions of each of said open-ended container shapes are of about the same length as one another.

15. The integrated assembly of claim 14 wherein:

a first leg region of the A transistor is adjacent to a second leg region of the B transistor:

a first interconnect couples to the first leg region;

a second interconnect couples to the second leg region; and the first interconnect is offset relative to the second interconnect along the first direction.

16. The integrated assembly of claim 9 wherein:

the A transistor has a first source/drain region within the opening of the open-ended container shape of the first transistor gate, and has a second source/drain region in an area between the A transistor and the A' transistor;

the B transistor has a third source/drain region within the opening of the open-ended container shape of the second transistor gate, and has a fourth source/drain region in an area between the B transistor and the B' transistor;

the A' transistor has a fifth source/drain region within the opening of the open-ended container shape of the third transistor gate, and has a sixth source/drain region coupled with the second source/drain region; and the B' transistor has a seventh source/drain region within the opening of the open-ended container shape of the fourth transistor gate, and has an eighth source/drain region coupled with the fourth source/drain region.

17. The integrated assembly of claim 16 wherein:

the A, B, A' and B' transistors are n-channel devices:

the A and B transistors are within a first sense amplifier;

the A' and B' transistors are within a second sense amplifier; and an n-latch circuit is coupled with the second, fourth, sixth and eighth source/drain regions.

18. The integrated assembly of claim 16 wherein:

the A, B, A' and B' transistors are p-channel devices:

the A and B transistors are within a first sense amplifier;

the A' and B' transistors are within a second sense amplifier; and an active pull-up circuit is coupled with the second, fourth, sixth and eighth source/drain regions.

* * * * *